United States Patent
Mathur et al.

(10) Patent No.: US 11,424,716 B2
(45) Date of Patent: Aug. 23, 2022

(54) DUAL VOLTAGE HIGH SPEED RECEIVER WITH TOGGLE MODE

(71) Applicant: Western Digital Technologies, Inc., San Jose, CA (US)

(72) Inventors: Shiv Mathur, Bangalore (IN); Ashish Savadia, Bangalore (IN); Tejaswini K, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/185,120

(22) Filed: Feb. 25, 2021

(65) Prior Publication Data

US 2022/0200533 A1   Jun. 23, 2022

Related U.S. Application Data

(60) Provisional application No. 63/128,554, filed on Dec. 21, 2020.

(51) Int. Cl.
*H03F 1/02* (2006.01)
*H03F 3/45* (2006.01)

(52) U.S. Cl.
CPC ....... *H03F 1/0205* (2013.01); *H03F 3/45269* (2013.01)

(58) Field of Classification Search
CPC .................................................. H03F 1/0205
See application file for complete search history.

(56) References Cited

U.S. PATENT DOCUMENTS

| 4,513,258 | A | * | 4/1985 | Jamiolkowski | ........ | H03K 3/354 |
| | | | | | | 331/108 D |
| 5,631,606 | A | | 5/1997 | Tran | | |
| 6,590,453 | B2 | | 7/2003 | Tran et al. | | |
| 6,788,142 | B2 | | 9/2004 | Li et al. | | |
| 6,798,243 | B1 | | 9/2004 | Nguyen et al. | | |

(Continued)

OTHER PUBLICATIONS

Chung, Y. et al., "A 16-mW 8-Bit 1-GS/s Digital-Subranging ADC in 55-nm CMOS", IEEE Transactions on Very Large Scale Integration (VSLI) Systems, Apr. 2, 2014, vol. 23, No. 3, pp. 557-566.

*Primary Examiner* — Patricia T Nguyen
(74) *Attorney, Agent, or Firm* — Ravi Mohan; Rutan & Tucker, LLP

(57) ABSTRACT

Storage devices are capable of utilizing receiver devices with native devices configured to support lower voltage supplies for higher read performances. The receiver device may include a current source circuit, first and second stage circuits, and a duty cycle balancer circuit. The first stage circuit may utilize first and second native devices with a threshold voltage (VTH) that enables proper lower voltage operations in saturation at high speeds. The current source stage circuit may utilize a third native device to track a transconductance and provide a reference current that becomes proportional to VTH to maintain tighter gain across process, variation, and temperature (PVT). The second stage circuit may utilize a current folding stage to provide a high gain for faster conversion of intermediate signals. The duty cycle balancer may utilize a fourth native device to balance a rise and fall delay skew across the PVT to maintain tighter duty cycle.

14 Claims, 9 Drawing Sheets

(56) References Cited

U.S. PATENT DOCUMENTS

| | | | | |
|---|---|---|---|---|
| 7,119,612 | B1* | 10/2006 | Holloway | H03F 1/02 |
| | | | | 330/9 |
| 8,575,905 | B2* | 11/2013 | Bulzacchelli | G05F 1/575 |
| | | | | 323/274 |
| 9,859,932 | B2 | 1/2018 | Hwang | |
| 10,418,952 | B1* | 9/2019 | Abhishek | H03F 3/45179 |
| 10,840,960 | B1* | 11/2020 | Al-Shyoukh | H04B 1/16 |
| 2016/0181988 | A1* | 6/2016 | Du | H03G 3/345 |
| | | | | 330/296 |

* cited by examiner

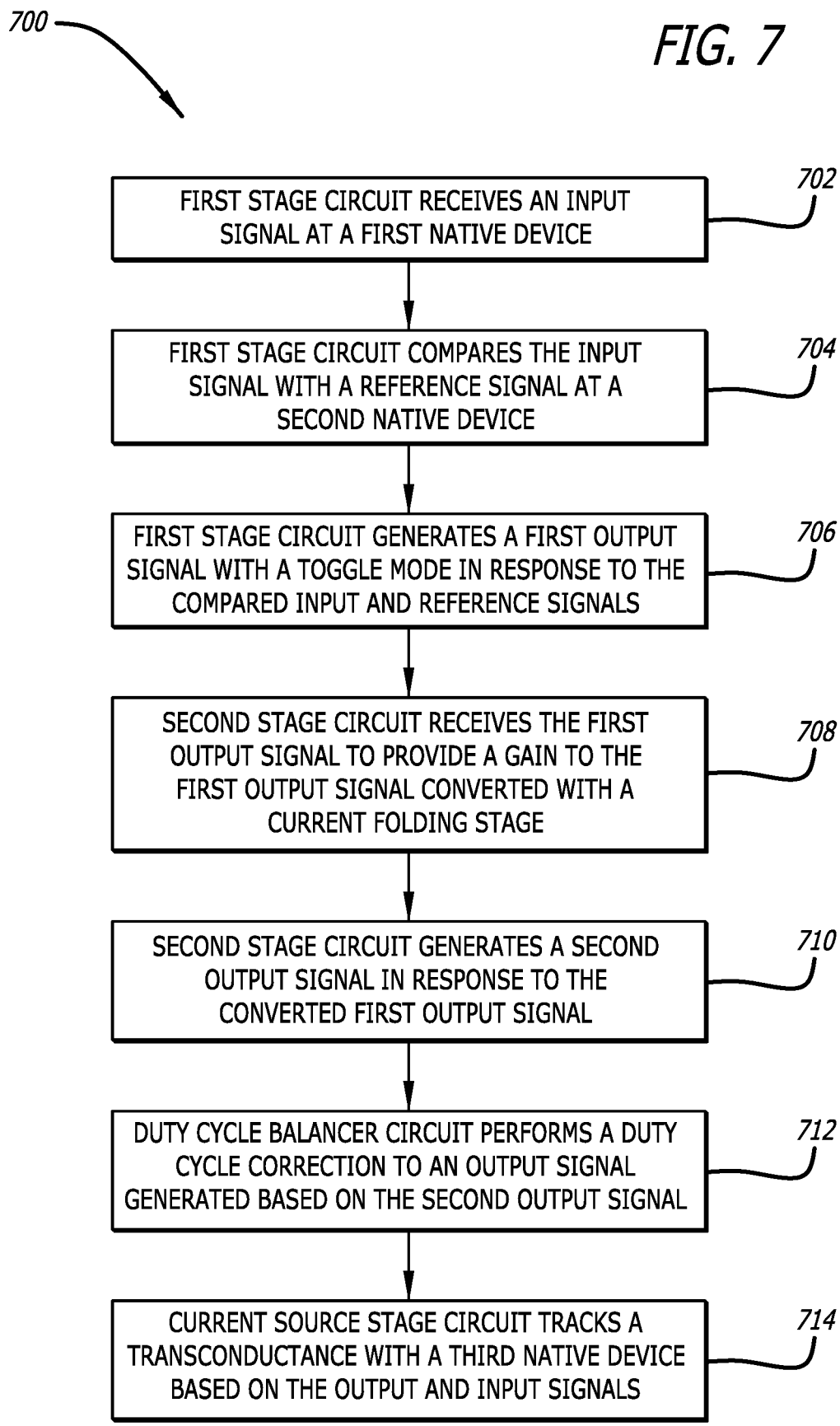

DUAL VOLTAGE HIGH SPEED RECEIVER WITH TOGGLE MODE

PRIORITY

This application claims the benefit of and priority to U.S. Provisional Application No. 63/128,554, filed Dec. 21, 2020, which is incorporated in its entirety herein.

FIELD

The embodiments of the present disclosure relate to storage devices. More particularly, the embodiments relate to high speed differential amplifier architectures with toggle mode (TM) for dual voltage operations.

BACKGROUND

Conventional application-specific integrated circuit (ASIC) receiver designs may typically include a two-stage pseudo-differential amplifier which compares an input voltage signal (VIN) with a static reference voltage signal (VREF). These receivers can provide a digital output that is down converted to a core voltage signal (VDD) level at an output voltage signal (VOUT) for various data recovery processes generally involved with flash interface modules (FIN/Is).

Conventional ASIC receiver designs encounter several limitations due to operational voltages, technology and reliability issues, and power and performance challenges. Such receiver design is generally required to support and properly operate both 1.8V and 1.2V voltage ranges. In order to operate both 1.8V and 1.2V power supplies, the receiver design may need input/output (IO) devices with an increased oxide thickness to ensure reliable operations for at least a ten year life cycle or longer. However, thicker devices are generally quite slow and adversely affect the overall performance.

Furthermore, the threshold voltage (VTH) of these IO devices heavily constrain the headroom. For example, maintaining these devices in saturation is generally not feasible at 1.2V operations, where the VTH is substantially high. Consequently, supporting 1.2V operations at these high speeds is difficult for these receiver designs. Moreover, in order to digitize a poor quality signal from long channels, the receiver design may require a minimum alternating current (AC) gain at an operation frequency. However, the design for a higher gain signal generally requires higher power which is limited due to the overall power budget needed to support handheld devices.

BRIEF DESCRIPTION OF DRAWINGS

The above, and other, aspects, features, and advantages of several embodiments of the present disclosure will be more apparent from the following description as presented in conjunction with the following several figures of the drawings. The drawings refer to embodiments of the present disclosure in which:

FIG. 7 is a flowchart illustration of a process for generating an output signal with a receiver device in accordance with embodiments of the present disclosure.

DETAILED DESCRIPTION

Figure 1A:
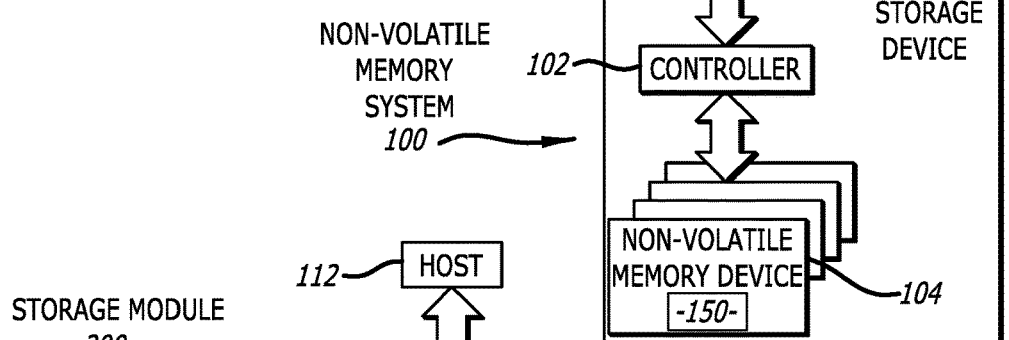
FIG. 1A is an exemplary block diagram illustration of a non-volatile memory system with a receiver device, in accordance with an embodiment of the present disclosure.

The embodiments described herein relate to storage devices, systems, and processes for providing high speed TM receiver architectures to support dual low voltage supplies. For example, the dual low voltage supplies may be a first low voltage supply and a second low voltage supply. In several embodiments, the first low voltage supply may be approximately a 1.8V supply, and the second low voltage supply may be approximately a 1.2V supply. Whereas, in other embodiments, the first low voltage supply may be approximately a 2.0V supply or lower, and the second low voltage supply may be approximately a 1.5V supply or lower. It should be appreciated, however, that the voltage levels recited herein are provided by way of non-limiting example. Consequently, various voltage supply levels and ranges may be supported without exceeding the spirit and scope of the present disclosure. Furthermore, as described in greater detail below, these embodiments include a non-volatile memory device comprising a receiver device with one or more native threshold voltage (NVT) devices used in one or more differential amplifier circuits. In most embodiments, the receiver device described herein may include, but is not limited to, a low gain first stage circuit, a transconductance (gm) tracking current source stage circuit, a high gain second stage circuit, and a duty cycle balancer circuit. For example, the first stage circuit may be designed with a first NVT device and a second NVT device, where both NVT devices may have a threshold voltage (VTH) of approximately zero to enable both dual low voltage supplies, such as 1.8V/1.2V, operations and such devices may thus be retained in saturation for proper operations at high speeds.

Moreover, in several embodiments, the current source stage circuit may be implemented with a third NVT device used to track the process of the device. For example, the current source stage circuit may be configured with a reference current signal (IBIAS) that becomes proportional to the VTH and thus facilitates in maintaining tighter gain across any process, variation, and temperature (PVT) related to the receiver device. In many embodiments, the second stage circuit may use a current folding stage to provide a high gain (e.g., a gain of approximately 17 db or greater) for a faster digital conversion from a first digital voltage output signal (VOP1) to a second digital voltage output signal (VOP2). Finally, in most embodiments, the duty cycle balancer may be configured to balance a rise and fall delay skew across PVT to maintain a tighter duty cycle.

Such embodiments ultimately facilitate storage devices and systems with the advantages of (i) effectively supplying and operating in both 1.8V and 1.2V supplies to enable substantially higher TM rates for high speed operations; (ii) utilizing a decreased footprint (or x-y area) for the receiver device, for example, a low silicon footprint of approximately 0.8× or less as no resistors are used for the design of the receiver device; (iii) providing a substantially lower power consumption such as, for example, approximately 0.8 mA or less for the performance of the receiver device; and (iv) facilitating a substantially tight budget requirement, PVT spread, and VREF variation and an increased (or wide) input slew-rate support of, for example, approximately 0.5V/ns to 5.5V/ns or greater. Additionally, the embodiments may provide several substantial improvements to the power, performance, and/or area requirements of the receiver devices described herein to thereby achieve substantially increase read performances for any of the storage systems described herein, which therefore helps to overcome the major bottle neck of products with low/poor read performances, as described in further detail in the embodiments below.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Finally, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1B:
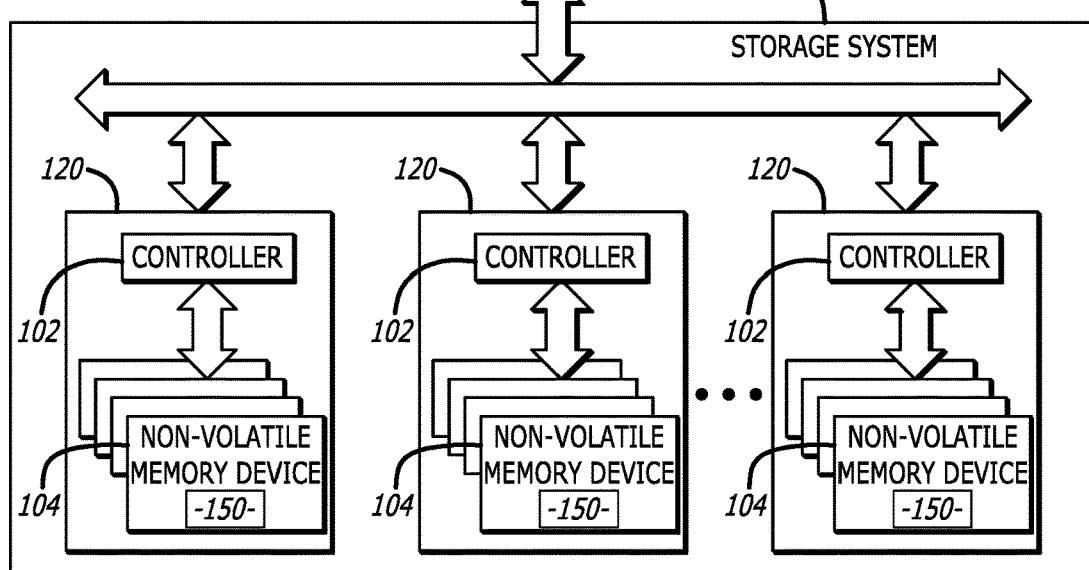
FIG. 1B is an exemplary block diagram illustration of a storage module with a storage system with a receiver device, in accordance with an embodiment of the present disclosure.
Figure 1C:
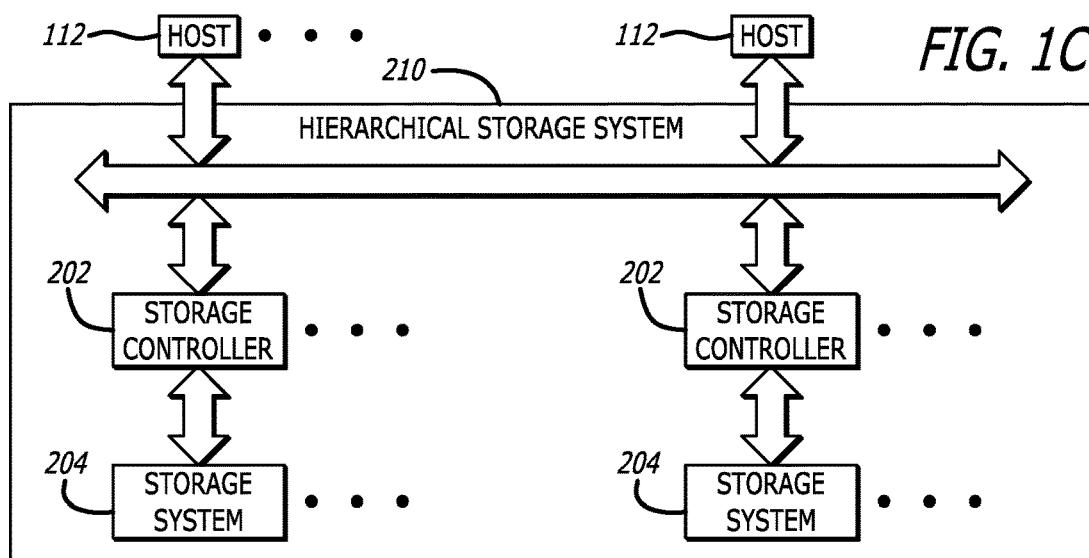
FIG. 1C is an exemplary block diagram illustration of a hierarchical storage system with a receiver device, in accordance with an embodiment of the present disclosure.

Examples of suitable non-volatile memory arrangements in which the systems and methods disclosed herein may be used are illustrated in FIGS. 1A-1C. That is, the following embodiments disclose non-volatile memory systems and devices and processes for providing high speed TM receiver architectures to support 1.8V and 1.2V supplies. Before turning to these and other embodiments, the following paragraphs provide some exemplary non-volatile memory systems, storage devices, and storage modules that can be used with such embodiments. It will be appreciated that any other suitable embodiments of non-volatile memory systems, devices, and/or storage modules may be used alone or in combination therewith, without limitation.

Referring now to FIG. 1A, an exemplary block diagram of a non-volatile memory system 100 is shown, in accordance with embodiments of the disclosure. The non-volatile memory system 100 includes a storage device 120 (or a non-volatile storage device) with a controller 102 and a non-volatile memory that may be comprised of one or more non-volatile memory device 104 (also referred to as NV memory, memory, memory dies, and so on). In some embodiments, the non-volatile memory device 104 may include a set of non-volatile memory cells—and associated circuitry (or logic) for managing the physical operation of those non-volatile memory cells—that are formed on a single semiconductor substrate. For example, the associated circuitry of the non-volatile memory device 104 may include one or more receiver devices 150 configured to provide high speed TM differential amplifier circuits to effectively support both 1.8V and 1.2V supplies.

In some embodiments, the controller 102 interfaces with a host 112 and transmits command sequences for read, program, and erase operations to the non-volatile memory device 104. The controller 102 may take the form of processing circuitry, a microprocessor or processor, and a computer-readable medium that stores computer-readable program code (e.g., software or firmware) executable by the (micro)processor, logic gates, switches, an ASIC, a programmable logic controller, and an embedded microcontroller, for example. The controller 102 may be configured with various hardware and/or firmware to perform the various functions described below and shown in the flow diagrams. Also, some of the components shown as being internal or external to the controller 102 can be respectively stored external or internal to the controller, and other components can be used. For example, the associated circuitry of the controller 102 may include one or more receiver devices, such as the receiver devices 150, configured to provide high speed TM differential amplifier circuits to effectively support both 1.8V and 1.2V supplies, as described below in further detail.

In some embodiments, the controller 102 may be a flash memory controller or the like. A flash memory controller may be a device that manages data stored on flash memory and communicates with a host, such as a computer or electronic device. A flash memory controller can have functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. Note that, alternatively, the host may provide the physical address. The flash memory controller can also perform various memory management functions, such as, but not limited to, wear leveling (i.e., distributing writes to avoid wearing out specific blocks of memory that would otherwise be repeatedly written to), garbage collection (i.e., after a block is full, moving only the valid pages of data to a new block, so the full block can be erased and reused), and/or any other similar memory management functions.

The interface between the controller 102 and the non-volatile memory device 104 may be any suitable flash interface, such as a double data rate (DDR) interface or the like. In one embodiment, the non-volatile memory system 100 may be a card-based system, such as a secure digital (SD) or a micro secure digital (micro-SD) card. In an alternate embodiment, the non-volatile memory system 100 may be part of an embedded memory system.

The non-volatile memory device 104 may include any suitable storage device, medium, or element, including NAND flash memory cells and/or NOR flash memory cells. The memory cells can take the form of solid-state (e.g., flash) memory cells and can be one-time programmable, few-time programmable, or many-time programmable. Additionally, as noted above, the memory cells can also be single-level cells (SLCs), multi-level cells (MLCs), triple-level cells (TLCs), quad-level cells (QLCs), or use any other memory technologies, now known or later developed. Also, the memory cells can be arranged in a two-dimensional or three-dimensional configuration, without limitation.

In many embodiments, the receiver device 150 may be configured to generate output voltage signals VOUT using, by way of non-limiting example, a low gain first stage circuit with a tracking current source stage circuit, a high gain second stage circuit, and a duty cycle balancer circuit. As described above, the receiver device 150 may be designed as a high speed TM differential amplifier architecture, which may support both 1.8V and 1.2V high speed operations. Furthermore, the receiver device 150 may be designed with a plurality of NVT devices that are used within different stages of the high speed TM differential amplifier architecture. In most embodiments, the NVT device may include, by way of non-limiting example, a native negative-channel (or n-type) metal-oxide semiconductor (MOS) (NMOS) transistor device and/or the like.

For example, the NMOS transistor device may be a type of transistor in which the channel of the transistor is doped (or composed) with a majority of electrons as current carriers. Additionally, as noted, the native NMOS transistor device (i.e., the NVT device) may have approximately a zero VTH. That is, in some embodiments, the receiver device 150 may use native NMOS (or VTH≈0V) to give a near rail to rail input common mode range, and a native NMOS) source follower on the output stage to give a high gain voltage output. For example, the receiver device 150 may use two or more NVT devices to keep the first stage circuit in saturation or in a saturation region for a predetermined time period, which enables the first stage circuit to maintain a low gain for VOP1 and the second stage circuit to generate a high gain for VOP2.

Additionally, it should be noted that as shown in FIG. 1A, the non-volatile memory system 100 includes a single channel between the controller 102 and the non-volatile memory device 104. Although the illustrated embodiment shows a single-memory channel, any number of channels may be utilized without exceeding beyond the spirit and scope of the present disclosure. For example, in some NAND memory system architectures, 2, 4, 8 or more NAND channels may exist between the controller 102 and the NAND memory device(s) based on the controller capabilities. As such, in any of the other embodiments described herein, a single channel and/or two or more channels may exist between the controller and the memory die(s), even if a single channel is shown in the drawings.

Referring now to FIG. 1B, an exemplary block diagram of a storage module 200 is shown, in accordance with embodiments of the disclosure. The storage module 200 includes a storage system 204 having a plurality of storage devices 120, in accordance with some embodiments. As such, the storage module 200 may include one or more non-volatile memory systems similar to the non-volatile memory system 100 in FIG. 1A. In some embodiments, the storage module 200 may include a storage controller 202 that interfaces with the host 111 and the storage system 204, which includes the non-volatile memory systems comprised of the storage devices 120, the non-volatile memory devices 104 with the receiver devices 150, and the controllers 102. The interface between storage controller 202 and the non-volatile memory systems (or the storage devices 120) may be a bus interface, such as a serial advanced technology attachment (SATA) or peripheral component interface express (PCIe) interface. In some embodiments, the storage module 200 may be a solid-state drive (SSD), as found in portable computing devices, such as laptop computers, and tablet computers.

Referring now to FIG. 1C, an exemplary block diagram of a hierarchical storage system 210 is shown, in accordance with embodiments of the disclosure. In some embodiments, the hierarchical storage system 210 may include a plurality of storage controllers 202, each of which control a respective storage system 204. Additionally, the hierarchical storage system 210 may be communicatively coupled to one or more hosts 112 (or hosts systems) that may access memories within the hierarchical storage system 210 via a bus interface (or the like). In one embodiment, the bus interface may be a non-volatile memory express (NVMe), a fiber channel over Ethernet (FCoE) interface, or the like. In one embodiment, the hierarchical storage system 210 illustrated in FIG. 1C may be a rack mountable mass storage system that is accessible by multiple host computers, as would be found in a data center or other locations where mass storage is needed.

Figure 2:
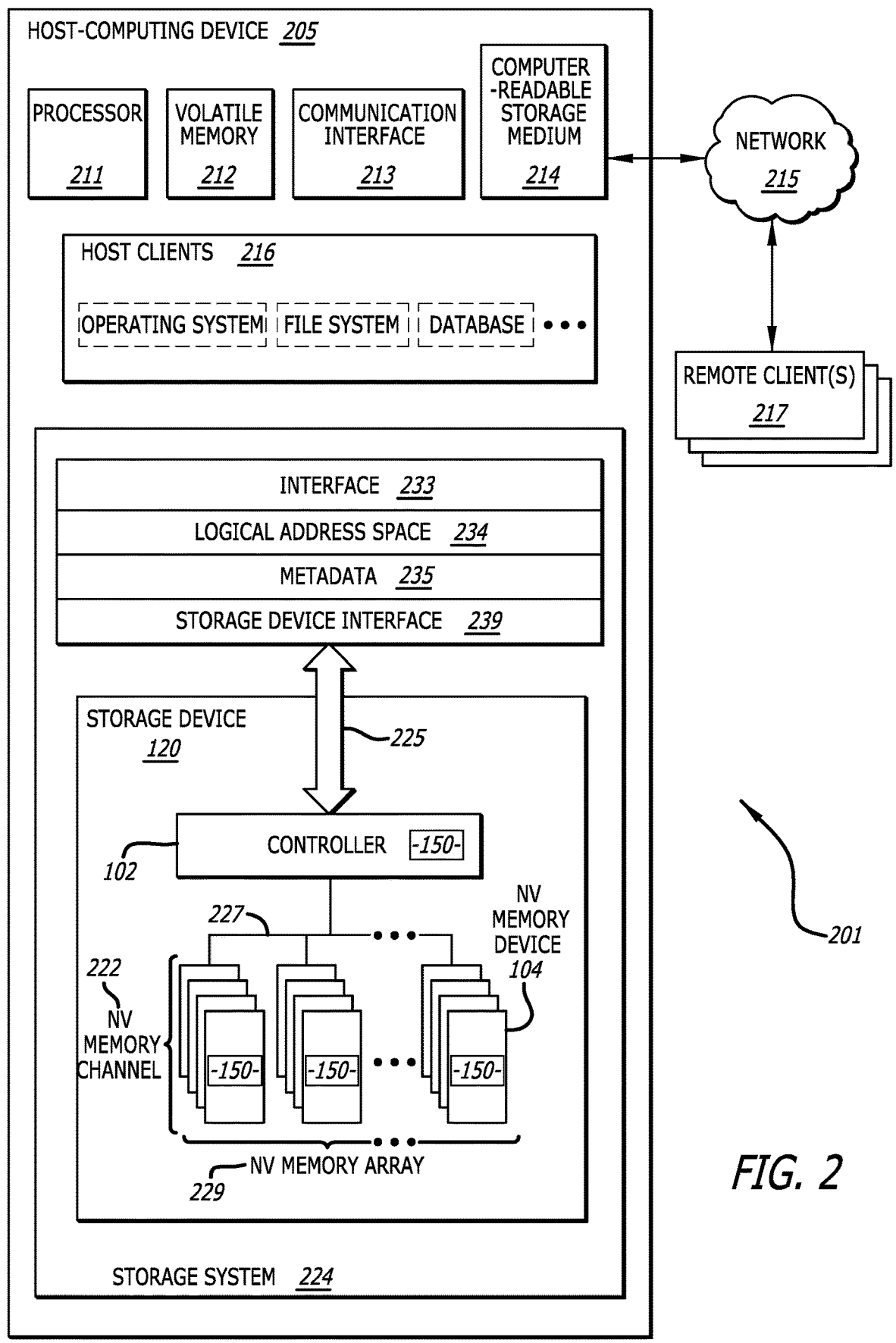
FIG. 2 is a schematic block diagram illustration of a system with a host-computing device and a storage device with a receiver device, in accordance with an embodiment of the present disclosure.

Referring now to FIG. 2, a schematic block diagram of a computing system 201 with a host-computing device 205 and a storage system 224 is shown, in accordance with embodiments of the disclosure. The computing system 201 may include one or more storage devices 120 with one or more receiver devices 150 in the storage system 224 that is communicatively coupled to the host-computing device 205 via a controller 102. The receiver devices 150 may be substantially similar to the receiver devices 150 depicted in FIGS. 1A-B. Likewise, the host-computing device 205 may be similar to the host 112 described above with regard to FIGS. 1A-C. The host-computing device 205 may include a processor 211, a volatile memory 212, and a communication interface 213. The processor 211 may include one or more central processing units, one or more general-purpose processors, one or more application-specific processors, one or more virtual processors (e.g., the host-computing device 205 may be a virtual machine operating within a host), one or more processor cores, or the like. The communication interface 213 may include one or more network interfaces configured to communicatively couple the host-computing device 205 and/or controller 102 of the storage device 120 to a network 215 (or a communication network), such as an Internet Protocol (IP) network, a Storage Area Network (SAN), a wireless or wired network, or the like.

In some embodiments, the storage device 120 may be disposed in one or more different locations relative to the host-computing device 205. In other embodiments, the storage device 120 may be disposed strictly within the storage system 224, where the storage system 224 and the host-computing device 205 are separate components that communicate over a bus or the like. In one embodiment, the storage device 120 comprises one or more non-volatile memory devices (or dies) 104 with the receiver devices 150, such as any type of semiconductor devices and/or other similarly integrated circuit devices disposed on one or more PCBs, storage housings, and/or other mechanical and/or electrical support structures. For example, the storage device 120 may include the receiver devices 150, one or more direct inline memory module (DIMM) cards, one or more expansion cards and/or daughter cards, a SSD or other hard drive device, and/or may have another memory and/or storage form factor. The storage device 120 may be integrated with and/or mounted on a motherboard of the host-computing device 205, installed in a port and/or slot of the host-computing device 205, installed on a different host-computing device 205 and/or a dedicated storage appliance on the network 215, in communication with the host-computing device 205 over an external bus (e.g., an external hard drive or the like), or the like.

In additional embodiments, the storage device 120 may be disposed on a memory bus of a processor 211 (e.g., on the same memory bus as the volatile memory 212, on a different memory bus from the volatile memory 212, in place of the volatile memory 212, or the like). In a further embodiment, the storage device 120 may be disposed on a peripheral bus of the host-computing device 205, such as a peripheral component interconnect express (PCI Express or PCIe) bus such as, but not limited to, a NVMe interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a network 215, such as an Ethernet network, an Infiniband network, SCSI RDMA over a network, a storage area network (SAN), a local area network (LAN), a wide area network (WAN) such as the Internet, another wired and/or wireless network, or the like.

The host-computing device 205 may further comprise computer-readable storage medium 214. The computer-readable storage medium 214 may comprise executable instructions configured to cause the host-computing device 205 (e.g., processor 211) to perform steps of one or more of the methods disclosed herein. Additionally, or in the alternative, the buffering component 250 may be embodied as one or more computer-readable instructions stored on the computer-readable storage medium 214.

For some embodiments, the controller 102 (or a device driver) may present a logical address space 234 to the host clients 216. The logical address space 234 may comprise a plurality (e.g., range) of logical addresses. The logical address space 234 may refer to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The controller 102 (or the driver) of the storage device 120 may maintain metadata 235, such as a logical to physical address mapping structure, to map logical addresses of the logical address space 234 to media storage locations on the storage device(s) 120. The controller 102 may be configured to provide storage services to one or more host clients 216. The host clients 216 may include local clients operating on the host-computing device 205 and/or remote clients 217 (or remote host clients) accessible via the network 215 and/or communication interface 213. The host clients 216 may include, but are not limited to: operating systems, file systems, database applications, server applications, kernel-level processes, user-level processes, applications, and the like.

The controller 102 may be further communicatively coupled to one or more storage systems 224 that may include different types and configurations of storage devices 120 such as, but not limited to, solid-state storage devices, semiconductor storage devices, SAN storage resources, or the like. The one or more storage devices 120 may comprise one or more respective controllers 102 and non-volatile memory channels 222. The controller 102 may provide access to the one or more storage devices 120 via any compatible protocols or interface 233 such as, but not limited to, SATA and PCIe. The metadata 235 may be used to manage and/or track data operations performed through the protocols or interfaces 233. The logical address space 234 may comprise a plurality of logical addresses, each corresponding to respective media locations of the one or more storage devices 120. The controller 102 may maintain metadata 235 comprising any-to-any mappings between logical addresses and media locations.

The controller 102 may further comprise and/or be in communication with a storage device interface 239 configured to transfer data, commands, and/or queries to the one or more storage devices 120 over a bus 225, which may include, but is not limited to, a memory bus of a processor 211, a PCI Express or PCIe bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 215, Infiniband, SCSI RDMA, or the like. The storage device interface 239 may communicate with the one or more storage devices 120 using input-output control (IO-CTL) command(s), IO-CTL command extension(s), remote direct memory access, or the like.

The communication interface 213 may comprise one or more network interfaces configured to communicatively couple the host-computing device 205 and/or the controller 102 to a network 215 and/or to one or more remote clients 217. The controller 102 may be part of and/or in communication with the one or more storage devices 120. Also, although FIG. 2 illustrates a single storage device 120, the computing system 201 and/or the storage system 224 are not limited in this regard and could be adapted to incorporate any number of storage devices 120.

The storage device 120 may comprise one or more non-volatile memory devices 104 of non-volatile memory channels 222, which may include, but is not limited to, ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silico-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 104 of the non-volatile memory channels 222, in certain embodiments, may comprise storage class memory (SCM) (e.g., write in place memory, or the like).

While the non-volatile memory channels 222 may be referred to as "memory media" in various embodiments, the non-volatile memory channels 222 may more generally comprise one or more non-volatile recording media capable of recording data that may be referred to as a non-volatile memory medium, a non-volatile storage medium, or the like. Further, the storage device 120, in various embodiments, may comprise a non-volatile recording device, a non-volatile memory array, a plurality of interconnected storage devices in an array, or the like.

The non-volatile memory channels 222 may comprise one or more non-volatile memory devices 104 along with the receiver devices 150, which may include, but are not limited to, chips, packages, planes, dies, and/or the like. The controller 102 may be configured to manage data operations on the non-volatile memory channels 222, and may comprise one or more processors, programmable processors (e.g., FPGAs), ASICs, micro-controllers, or the like. In some embodiments, the controller 102 may be configured to store data on and/or read data from the non-volatile memory channels 222, to transfer data to/from the storage device 120, and so on. For example, as shown in FIG. 2, the controller 102 may include one or more receiver devices 150 that may be used to facilitate the controller 102 to store data on and/or read data from the non-volatile memory channels 222, to transfer data to/from the storage device 120, and so on.

The controller 102 may be communicatively coupled to the non-volatile memory channels 222 by way of a bus 227. The bus 227 may comprise an I/O bus for communicating data to/from the non-volatile memory devices 104 along with the receiver devices 150. The bus 227 may further comprise a control bus for communicating addressing and other command and control information to the non-volatile memory devices 104 along with the receiver devices 150. In some embodiments, the bus 227 may communicatively couple the non-volatile memory devices 104 along with the receiver devices 150 to the controller 102 in parallel. This parallel access may allow the non-volatile memory devices 104 along with the receiver devices 150 to be managed as a group, forming a non-volatile memory array 229. The non-volatile memory devices 104 along with the receiver devices 150 may be partitioned into their respective logical memory units (e.g., logical pages) and/or logical memory divisions (e.g., logical blocks and logical planes). The logical memory units may be formed by logically combining physical memory units of each of the non-volatile memory devices 104 and/or the receiver devices 150.

The controller 102 may organize a block of word lines within one or more of the non-volatile memory devices 104, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within one or more of the non-volatile memory devices 104 may be physically arranged in a monotonically increasing sequence of word line addresses, with consecutively addressed word lines also being physically adjacent.

The controller 102 may compromise and/or be in communication with a device driver that is being executed on the host-computing device 205. For example, the controller 102 and/or such device driver may provide storage services to the host clients 216 via one or more interfaces 233. Likewise, the controller 102 and/or such device driver may further comprise a storage device interface 239 that is configured to transfer data, commands, and/or queries to the controller 102 over the bus 225, as described above.

The receiver device 150 may be part of and/or in communication with the controller 102, the non-volatile memory devices 104, and/or the like. The receiver device 150 may operate on the storage system 224 of the host-computing device 205. In some embodiments, or alternative embodiments, the receiver device 150 may be embodied as one or more computer readable instructions stored on the computer-readable storage medium 214.

In some embodiments, the receiver device 150 may comprise logic hardware of one or more components of the storage device 120, such as the controller 102, the non-volatile memory devices 104 (or elements), a device controller, a field-programmable gate array (FPGA) or other programmable logic, firmware for an FPGA or other programmable logic, microcode for execution on a microcontroller, an ASIC, and/or the like. In other embodiments, the receiver device 150 may comprise executable software code, such as a device driver or the like, stored on the computer-readable storage medium 214 for execution on the processor 211. In further embodiments, the receiver device 150 may include a combination of both executable software code and logic hardware.

Figure 3A:
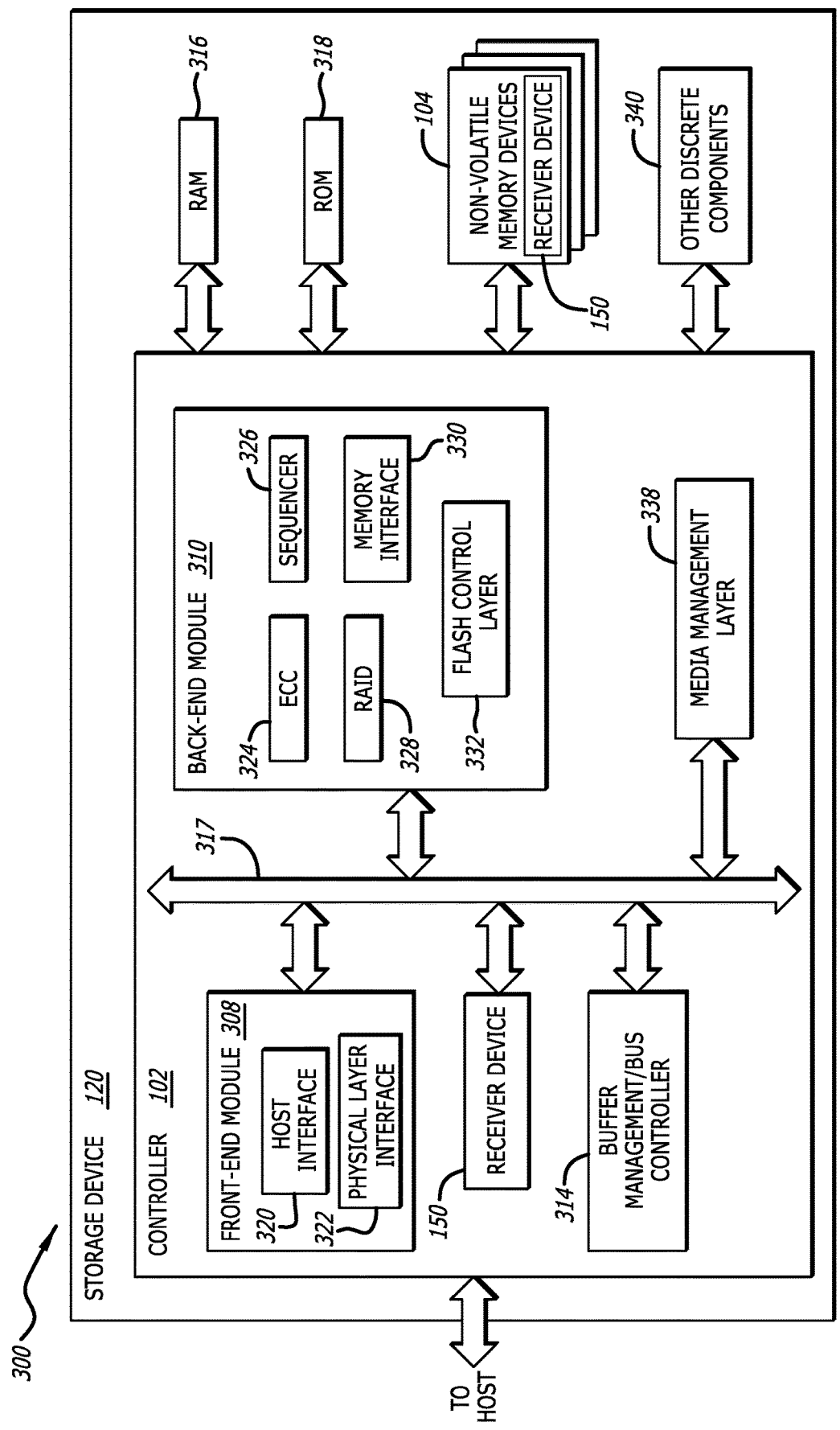
FIG. 3A is a schematic block diagram illustration of an embodiment of a controller of a storage device configured to generate an output signal with a receiver device, in accordance with an embodiment of the present disclosure.

Referring now to FIG. 3A, a schematic block diagram of a system 300 with exemplary components of the storage device 120 is shown, in accordance with embodiments of the disclosure. The controller 102 may include a front-end module 308 that interfaces with a host, a back-end module 310 that interfaces with the non-volatile memory device(s) (or die(s)) 104 along with the receiver devices 150, and various other modules that perform various functions of the non-volatile memory system 100. In some embodiments, the controller 102 may include one or more receiver devices 150 similar to the receiver devices 150 of the non-volatile memory devices 104. The storage device 120 may include the non-volatile memory devices 104 in conjunction with the receiver devices 150 that are communicatively coupled to the controller 102. The receiver devices 150 may be substantially similar to the receiver devices 150 depicted in FIGS. 1A-B and 2.

In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, each module may include memory hardware that comprises instructions executable with a processor or processor circuitry to implement one or more of the features of the module. When any of the one or more modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer management/bus controller 314 that manages buffers in random access memory (RAM) 316 and controls the internal bus arbitration for communication on an internal communications bus 317 of the controller 102. A read only memory (ROM) 318 may store and/or access system boot code. Also, although both the RAM 316 and ROM 318 in FIG. 3A are illustrated as located separately from the controller 102, the RAM 316 and/or the ROM 318 may be located within the controller 102 in other embodiments. In yet another embodiment, portions of the RAM 316 and/or the ROM 318 may be located both within the controller 102 and outside the controller 102. Further, in some implementations, the controller 102, the RAM 316, and the ROM 318 may be located on separate semiconductor devices (or dies).

Additionally, the front-end module 308 may include a host interface 320 and a physical layer interface 322 that provide the electrical interface with the host or next level storage controller. The choice of the type of the host interface 320 can depend on the type of memory being used. Examples types of the host interface 320 may include, but are not limited to, SATA, SATA Express, SAS, Fibre Channel, USB, PCIe, and NVMe. The host interface 320 may typically facilitate transfer for data, control signals, and timing signals.

The back-end module 310 may include an error correction controller (ECC) engine 324 that encodes the data bytes received from the host and decodes and error corrects the data bytes read from the non-volatile memory device(s) 104 along with the receiver devices(s) 150. As discussed below, the ECC engine 324 may be tunable, so as to generate varying amounts of ECC data based on the mode (e.g., generate normal mode ECC data in normal programming mode and generate mixed mode ECC data in mixed mode programming mode, with the mixed mode ECC data being greater than the normal mode ECC data). The back-end module 310 may also include a command sequencer 326 that generates command sequences, such as program, read, and erase command sequences, to be transmitted to the non-volatile memory device(s) 104 along with the receiver devices(s) 150.

Additionally, the back-end module 310 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 328 may be a part of the ECC engine 324. A memory interface 330 provides the command sequences to the non-volatile memory device(s) 104 along with the receiver devices(s) 150 and receives status information from the non-volatile memory device(s) 104 along with the receiver devices(s) 150. In addition to the command sequences and status information, data to be programmed into and read from the non-volatile memory device(s) 104 along with the receiver devices(s) 150 may be communicated through the memory interface 330. In one embodiment, the memory interface 330 may be a double data rate (DDR) interface. A flash control layer 332 may control the overall operation of the back-end module 310.

Additional modules of the non-volatile memory system 100 illustrated in FIG. 2A may include a media management layer 338, which performs wear leveling of memory cells of the non-volatile memory device 104. The non-volatile memory system 100 may also include other discrete components 340, such as external electrical interfaces, external RAM, resistors, capacitors, or other components that may interface with controller 102. In alternative embodiments, one or more of the RAID modules 328, media management layer 338, and the buffer management/bus controller 314 are optional components that may not be necessary in the controller 102.

Figure 3B:
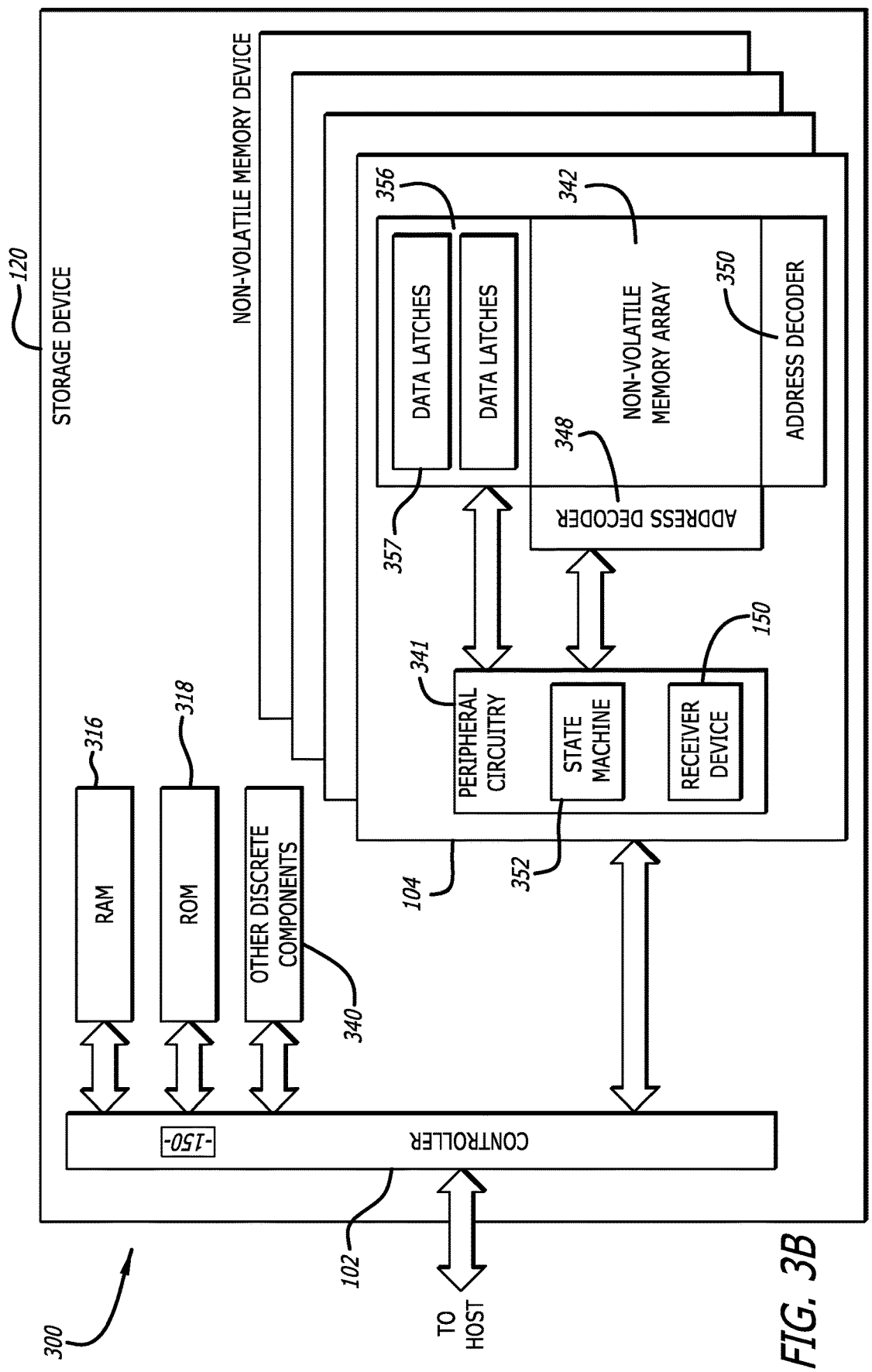
FIG. 3B is a schematic block diagram illustration of an embodiment of a non-volatile memory device of a storage device configured to generate an output signal with a receiver device, in accordance with an embodiment of the present disclosure.

Referring now to FIG. 3B, the system 300 with exemplary components of the storage device 120 is shown, in accordance with embodiments of the disclosure. The storage device 120 may be communicatively coupled to a host with the controller 102. The controller 120 may include one or more receiver devices 150. The non-volatile memory device 104 may include one or more receiver devices 150. The receiver devices 150 may be substantially similar to the receiver devices 150 depicted in FIGS. 1A-B, 2, and 3A. In most embodiments, the receiver devices 150 of the controller 102 may be substantially similar to the receiver devices 150 of the non-volatile memory device 104. While, in other embodiments, the receiver devices 150 of the controller 102 may be different from the receiver devices 150 of the non-volatile memory device 104. The non-volatile memory device 104 may also include a non-volatile memory array 342. The non-volatile memory array 342 may include a plurality of non-volatile memory elements or cells, each configured to store one or more bits of data. The non-volatile memory elements or cells may be any suitable non-volatile memory cells, including NAND flash memory cells and/or NOR flash memory cells in a two-dimensional configuration and/or a three-dimensional configuration. The memory cells may take the form of solid-state (e.g., flash) memory cells and can be one-time programmable, few-time programmable, or many-time programmable. In addition, as described above, the memory elements or cells may be configured as SLCs that store a single bit of data per cell, multi-level cells MLCs that store multiple bits of data per cell, or combinations thereof. For example, in these embodiments, the MLCs include TLCs, QLCs, and so on, that store three, four, and more than four bits of data per cell.

Additionally, a flash memory cell may include within the non-volatile memory array 342 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell.

Hereafter, FGTs, memory elements, and memory cells may be used interchangeably to refer to the same physical entity.

For example, the SLCs and the MLCs may be disposed in the non-volatile memory array 342 in accordance with a matrix-like structure of rows and columns of memory cells. At the intersection of a row and a column is a FGT (or memory cell). A column of FGTs may be referred to as a string. FGTs in a string or column may be electrically connected in series, whereas, a row of FGTs may be referred to as a page. Control gates of FGTs in a page or row may be electrically connected or otherwise coupled together.

The non-volatile memory array 342 may also include word lines and bit lines connected to the FGTs. Each page of FGTs is coupled to a word line. In particular, each wordline may be coupled to the control gates of FGTs in a page. In addition, each string of FGTs may be coupled to a bit line. Further, a single string may span across multiple word lines, and the number of FGTs in a string may be equal to the number of pages in a block.

In some embodiments, the non-volatile memory devices 104 may include a peripheral circuitry 341 with the one or more receiver device(s) 150 and one or more state machines 352 that may provide high speed read performances and status information respectively to the controller 102. The non-volatile memory device 104 may further includes a data cache 356 that caches data. The non-volatile memory device 104 may also include a row address decoder 348 and a column address decoder 350. The row address decoder 348 may decode a row address and select a particular word line in the non-volatile memory array 342 when reading or writing data to/from the memory cells in the non-volatile memory array 342. The column address decoder 350 may decode a column address to select a particular group of bit lines in the non-volatile memory array 342 to be electrically coupled to the data cache 344.

The data cache 356 may include sets of data latches 357 for each bit of data in a memory page of the non-volatile memory array 342. Thus, each set of data latches 357 may be a page in width, and a plurality of sets of data latches 357 may be included in the data cache 356. Additionally, in other embodiments, the controller 102 may be implemented in as a single integrated circuit chip and may communicate with the one or more different layers of memory in the non-volatile memory device 104 along with the receiver device 150 over one or more command channels. Note that, in other embodiments, controller executable code for implementing memory management instructions as described herein may be stored in the non-volatile flash memory.

Moreover, as described herein, the non-volatile memory array 342 may be arranged in blocks of memory cells in which one block of memory cells is the unit of erase, i.e., the smallest number of memory cells that are physically erasable together. For increased parallelism, however, the blocks may be operated in larger metablock (MB) units. One block from each of at least two planes of memory cells may be logically linked together to form a metablock.

Figure 4:
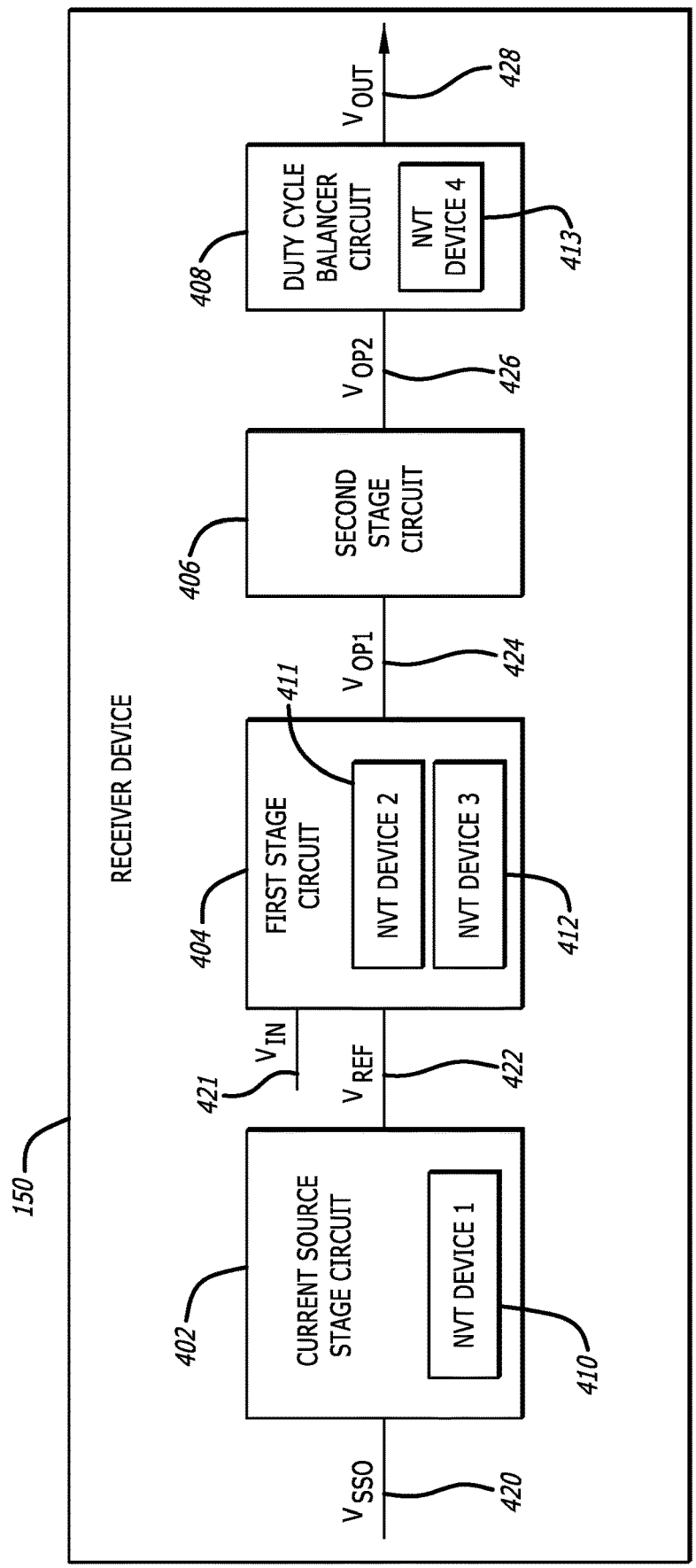
FIG. 4 is an exemplary block diagram illustration of a receiver device, in accordance with an embodiment of the present disclosure.

Referring now to FIG. 4, an exemplary block diagram illustration of a receiver device 150 is shown, in accordance with embodiments of the disclosure. For example, the receiver device 150 may be a part of the non-volatile memory device 104 depicted in FIGS. 1A-B, 2, and 3A-B. The receiver device 150 depicted in FIG. 4 may be substantially similar to the one or more receiver devices 150 depicted above in FIGS. 1A-B, 2, and 3A-B.

In many embodiments, the receiver device 150 may include, but is not limited to, a current source stage circuit 402, a first stage circuit 404, a second stage circuit 406, and a duty cycle balancer circuit 408. Furthermore, as shown in FIG. 4, the current source stage circuit 402 may include a NVT device 410; the first stage circuit 404 may include NVT devices 411-412; and the duty cycle balancer circuit 408 may include a NVT device 413. Although four circuits 402, 404, 406, 408 and four NVT devices 410-413 are shown in FIG. 4, it should be understood that any number of circuits and/or NVT devices may be utilized by the receiver device 150, without limitation.

The receiver device 150 may be configured to utilize the circuits 402, 404, 406, 408 and NVT devices 410-413 in the depicted arrangement to provide various voltage signals, such as an IO supply voltage 420 (or VDDO), an input signal VIN 421, a static reference voltage signal VREF 422, a first and second output voltage signals VOP1 424 and VOP2 426, and an output voltage signal VOUT 428. The first stage circuit 404 may receive the VIN 421 at the NVT device 412 and then compare the VIN 421 with the VREF 422 received at the NVT device 411. Additionally, in some embodiments, the first stage circuit 404 may be configured to generate the VOP1 424 with a low gain by using the NVT devices 411-412 to enable the TM for the receiver device 150, as all the respective devices of the first stage circuit 404 may be retained in saturation for proper 1.8V/1.2V high speed voltage operations.

The second stage circuit 406 may be configured to receive the VOP1 424, where the VOP1 424 may be an analog or digital output voltage signal. The second stage circuit 406 may utilize a current folding stage circuit (or the like) to provide a high gain (e.g., a gain of approximately 17 db or greater) to the VOP2 426, where the current folding stage may be used for faster digital conversion from the VOP1 424 to the VOP2 426. Furthermore, the duty cycle balancer circuit 408 may be configured to perform a duty cycle correction (or the like) to the VOUT 428 generated from the VOP2 426 using the current source stage circuit 402 along with the first and second stage circuits 404 and 406. For example, the duty cycle correction may be utilized to balance the rise and fall delay skey across PVT to thereby maintain a tighter duty cycle for the receiver device 150. Finally, the current source stage circuit 402 may be configured to track a transconductance using the NVT device 410 in response to the respective input reference voltage (e.g., VIN 421 or the like) and the respective reference current signal IBIAS (or the like) of the current source stage circuit 402. For example, the IBIAS of the current source stage circuit 402 may be proportional to the respective VTH to maintain a tighter gain across PVT.

Figure 5:
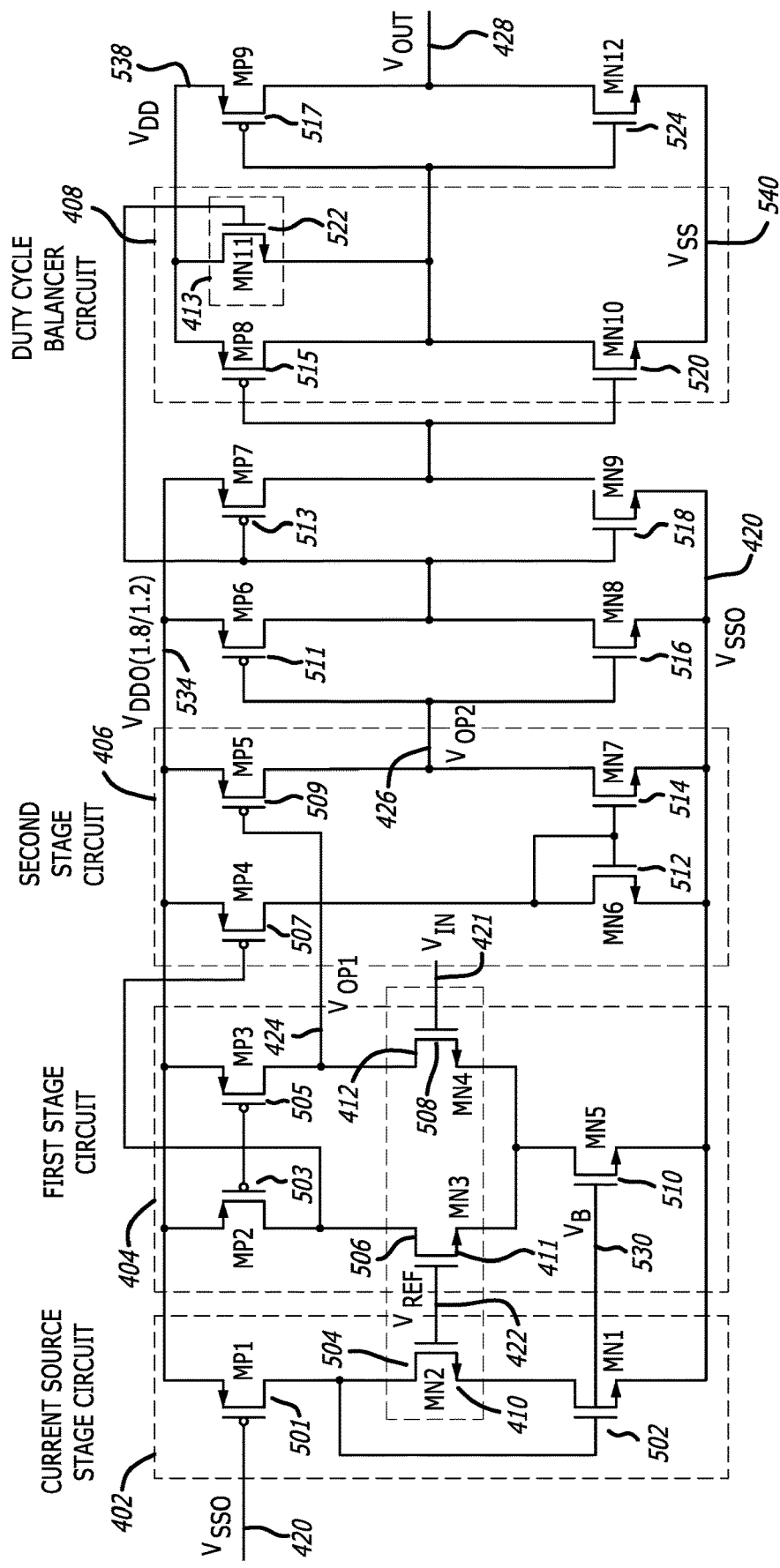
FIG. 5 is a detailed circuit illustration of a receiver device, in accordance with an embodiment of the present disclosure.

Referring now to FIG. 5, a detailed circuit illustration of the receiver device 150 with regards to FIG. 4 is shown, in accordance with embodiments of the disclosure. That is, with the discussion provided above in FIG. 4, an example implementation of the receiver device 150 may be depicted in FIG. 5 to provide greater detail. The receiver device 150 depicted in FIG. 5 may be similar to the one or more receiver devices 150 depicted in FIGS. 1A-B, 2, 3A-B, and 4. Furthermore, the receiver device 150 depicted in FIG. 5 may provide an arrangement of circuits comprising the current source stage circuit 402 with the NVT device 410, the first stage circuit 404 with the NVT devices 411-412, the second stage circuit 406, and the duty cycle balancer circuit 408 with the NVT device 413. Likewise, the arrangement of the circuits 402, 404, 406, 408 and NVT devices 410-413 depicted in FIG. 5 may be similar to the respective circuits 402, 404, 406, 408 and NVT devices 410-413 depicted in FIG. 4.

As shown in FIG. 5, the receiver device 150 may be configured respectively with the current source stage circuit 402, the first stage circuit 404, the second stage circuit 406, and the duty cycle balancer circuit 408 which are communicatively coupled to each other. In particular, each of the circuits are shown as including one or more p-channel metal-oxide-semiconductor field effect transistor (PMOS transistor devices) such as MP1-9, one or more n-channel metal-oxide-semiconductor field effect transistor (NMOS transistor devices) such as MN1-12, and one or more NMOS transistors being used as one or more NVT devices such as the MN2, the MN3, the MN4, and the MN11. For example, the current source stage circuit 402 may be shown as including (or utilizing) a first PMOS transistor MP1 501, a first NMOS transistor MN1502, and a second NMOS transistor MN2 504, where the second NMOS transistor MN2 504 is being utilized as the first NVT device 410.

In some embodiments, the PMOS transistors MP1-9 and/or the NMOS transistors MN1-12 may have one or more of their respective terminals communicatively coupled or tied together and are configured to receive/generate input/output signals for their respective circuits. In addition, the PMOS transistors MP1-9 may have source terminals coupled to a first (or positive) supply voltage VDD 538 and/or a first (or positive) IO supply voltage VDDO 534 of the example circuit shown for the receiver device 150, where the supply voltage VDD 538 may be configured with the TM to support both 1.8V/1.2V high speed operations. Whereas, the NMOS transistors MN1-12 may have source terminals coupled to a second supply voltage VSS 540 and/or a second IO supply voltage VSSO 420 of the example circuit shown for the receiver device 150, where the VSSO 420 and/or VSS 540 may be a negative power supply voltage, a ground reference voltage (GND), and/or the like. As described above, the PMOS/NMOS transistors MP1-9/MN1-12 may be configured to generate intermediate signals, such as a bias voltage signal 530 and both digital output voltages VOP1 424 and VOP2 426, and output signals, such as the output voltage signal VOUT 428 at associated low and high voltage levels corresponding to the respective supply voltages 420, 534, 538, and 540.

In most embodiments, the first stage circuit 404 may utilize PMOS transistors MP2-3 503, 505 and NMOS transistors MN3-5 506, 508, 510, where the NMOS transistors MN3-4 506, 508 are being utilized as the second and third NVT devices 411-412. Furthermore, in some embodiments, the second stage circuit 406 may utilize PMOS transistors MP4-7 507, 509, 511, 513 and NMOS transistors MN6-9 512, 514, 516, 518. For example, the NMOS transistor MN7 514 in conjunction with the PMOS transistor MP5 509 may be used to provide higher bandwidth as their gates moves in the same direction. Meanwhile, in several embodiments, the duty cycle balancer circuit 408 may utilize PMOS transistors MP8-9 515, 517 and NMOS transistors MN10-12 520, 522, 524, where the NMOS transistor MN11 522 is being utilized as the fourth NVT device 413. Although particular number and types of transistors are shown in FIG. 5, it should be understood that any number and types of transistors may be utilized by the receiver device 150, without limitation.

Figure 6A:
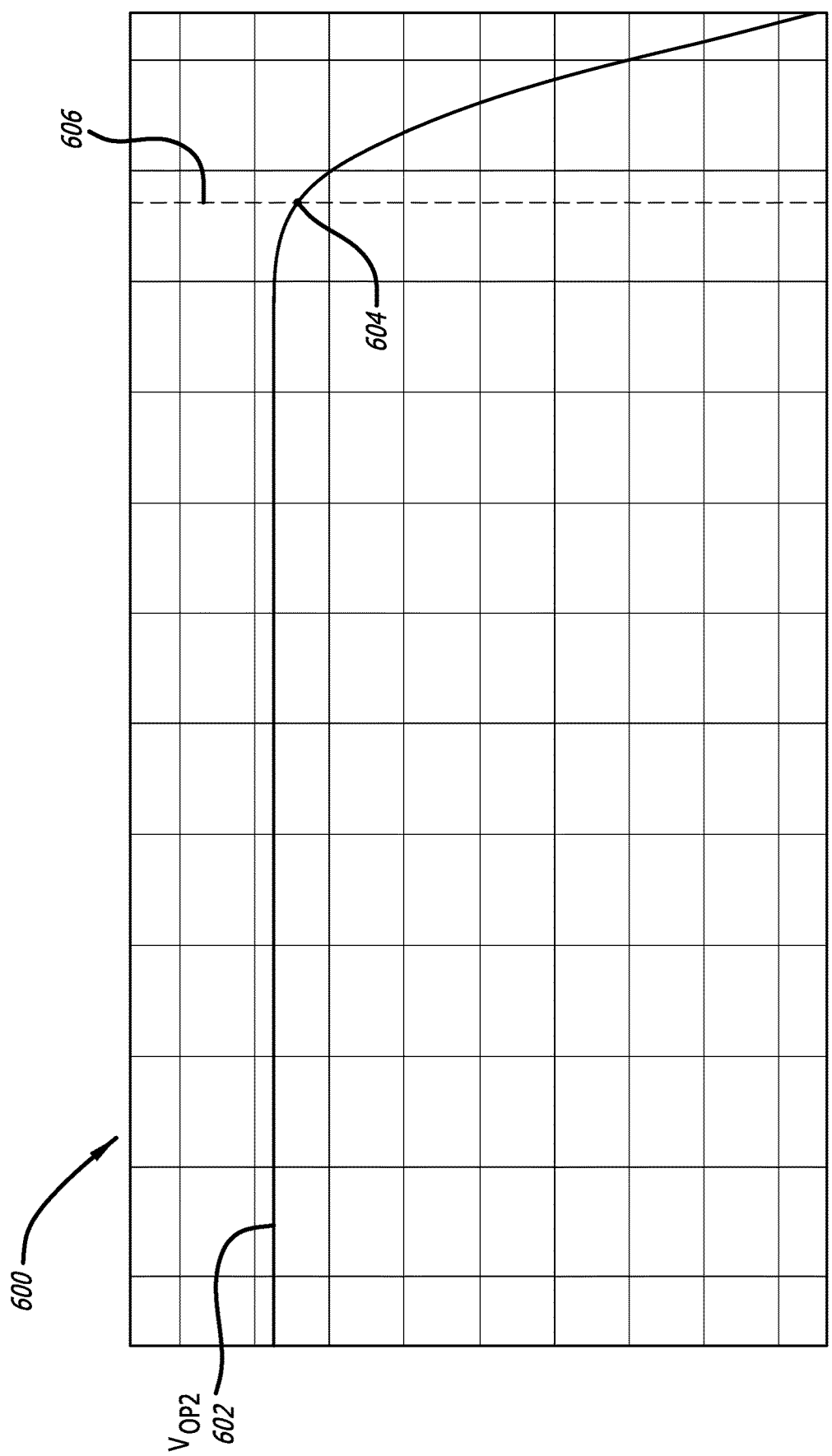
FIG. 6A is an AC gain diagram illustration of a digital output voltage signal, in accordance with an embodiment of the present disclosure.
Figure 6B:
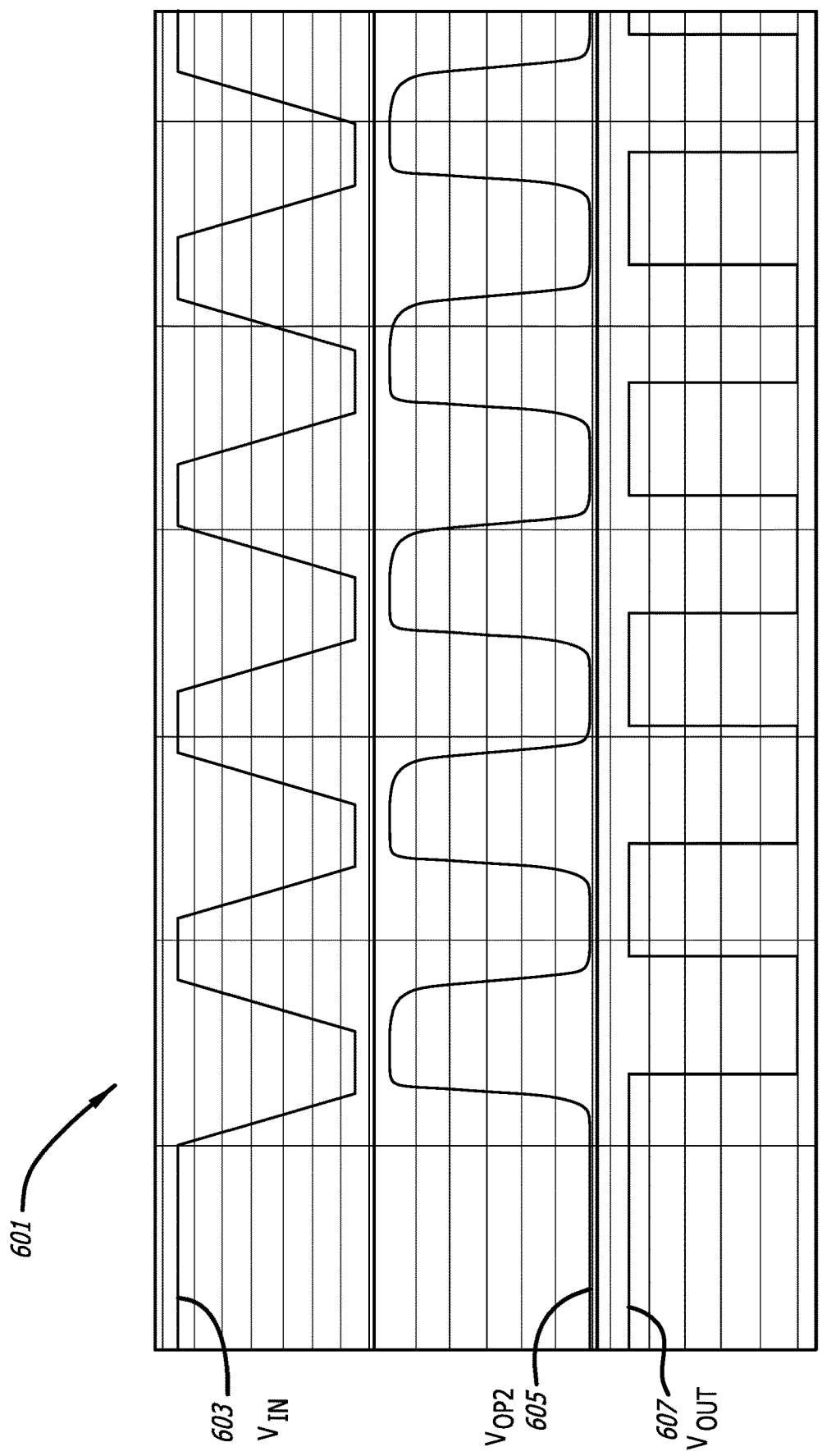
FIG. 6B is a timing diagram illustration of a variety of voltage signals, in accordance with an embodiment of the present disclosure.

Referring now to FIGS. 6A-6B, an AC gain diagram illustration 600 of a VOP2 signal 602 is shown, and a timing diagram illustration 601 of a VIN signal 603, a VOP2 signal 605, and a VOUT signal 607 is shown, in accordance with several embodiments of the disclosure. In particular, the AC gain illustration 600 of FIG. 6A may depict an AC gain 604 of the VOP2 signal 602 at a high bandwidth frequency 606 at a VOP2 node of a receiver device, where the AC gain 604 may approximately 17 db or greater for the VOP2 signal 602. Similarly, the timing illustration 601 of FIG. 6B may depict the timing cycles of the VIN signal 603, the VOP2 signal 605, and the VOUT signal 607 in relation to each other and generated using a receiver device. The receiver device used to capture the diagram illustrations 600-601 in FIGS. 6A-B may be substantially similar to the receiver device 150 depicted above in regards with FIGS. 1A-C, 2, 3A-B, and 4-5.

For example, the diagram illustrations 600-601 depicted in FIGS. 6A-B may be implemented using the receiver device at 1.2V operations, thereby capturing the AC gain plot and transient analysis for the high speed TM differential amplifier operations along with the limited swing of the VREF signal of approximately +150 mV (e.g., a VREF variation may be approximately 0.5*VDDO±2% or the like). This allows the receiver device to achieve (i) a tighter skew of approximately 4% or less (e.g., <100 ps) over any PVT, (ii) a wider slew spread of 0.5-5.5V/ns and Vref noise of 4% (or less), and/or a (iii) a substantially low current of 0.8 mA/Rx block or less. In addition, although several voltage signals, voltage operations, and voltage measurements may be depicted in FIGS. 6A-B, it should be understood that the receiver device described herein may be configured—along with any desired high speed TM receiver architecture—to generate any desired type of voltage signals, operations, and measurements, without limitations.

Referring now to FIG. 7, a high-level flowchart of an exemplary process 700 for generating an output voltage signal is shown, in accordance with some embodiments. The process 700 in FIG. 7 may depict one or more illustrations of one or more process flows described herein. For example, the process 700 may be configured to generate an output voltage signal with a high speed TM receiver device which may be substantially similar to the receiver device 150 depicted above in FIG. 4-5.

At block 702, the process 700 may configure a first stage circuit to receive an input signal at a first native device. For example, the first stage circuit 404 may be configured to receive the input signal VIN 421 using the NVT device 412 of the first stage circuit 404. At block 704, the process 700 may also configure the first stage circuit to compare the input signal with a reference signal at a second native device. For example, the first stage circuit 404 may be configured to compare the input signal VIN 421 with the static reference signal VREF 422 at the NVT device 411 of the first stage circuit 404. At block 706, the process 700 may further configure the first stage circuit to generate a first output signal with a toggle mode in response to the compared input and reference signals. For example, the first stage circuit 404 may be configured to generate the first digital output signal VOP1 424 with a low gain, where the NVT devices 411-412 may be utilized to enable the TM used for the dual voltage operations of the receiver device 150.

At block 708, the process 700 may configure a second stage circuit to receive the first output signal to provide a gain to the first output signal converted with a current folding stage. For example, the second stage circuit 406 may be configured to receive the first digital output signal VOP1 424 and to utilize the current folding stage of the second stage circuit 406 to provide a high gain that enables the faster digital conversion of the first digital output signal VOP1 424. At block 710, the process 700 may also configure the second stage circuit to generate a second output signal in response to the converted first output signal. For example, the second stage circuit 406 may be configured to generate the second digital output signal VOP2 426 in response to the faster digital conversion from the first digital output signal VOP1 424 to the generated second digital output signal VOP2 426. At block 712, the process 700 may configure a duty cycle balancer circuit to perform a duty cycle correction to an output signal generated based on the second output signal. For example, the duty cycle balancer circuit 408 may be configured to perform the duty cycle correction to the output signal VOUT 428 generated based on the second digital output signal VOP2 426, where the duty cycle correction may be utilized to balance the rise and fall delay skey across PVT to thereby maintain a tighter duty cycle for the receiver device 150. At block 714, the process 700 may configure a current source stage circuit to track a transconductance with a third native device based on the output and input signals. For example, the current source stage circuit 402 may be configured to track the transconductance of the receiver device 150 using the NVT device 410, where the reference current IBIAS of the current source stage circuit 402 may be proportional to the voltage threshold VTH to thereby maintain a tighter gain across PVT.

Information as shown and described in detail herein is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. An amplifier, comprising:
   a first stage circuit configured to:
      receive an input signal;
      compare a reference signal with the input signal; and
      generate a first output signal based on the compared input and reference signals;
   a second stage circuit configured to:
      receive the first output signal;
      convert the first output signal with a current folding stage;
      generate a second output signal in response to the converted first output signal; and
   a duty cycle balancer circuit configured to provide a duty cycle correction to an output signal generated in response to the second output signal; and
   a current source stage circuit configured to track a transconductance based on the output signal and the input signal.

2. The amplifier of claim 1, wherein:
   the first stage circuit includes a first native threshold voltage (NVT) device and a second NVT device,
   the first NVT device receives the reference signal, and
   the first stage circuit is configured to utilize both first and second NVT devices to enable a toggle mode (TM) between a first supply voltage and a second supply voltage.

3. The amplifier of claim 2, wherein the first supply voltage is a 1.8 supply voltage, and wherein the second supply voltage is a 1.2 supply voltage.

4. The amplifier of claim 1, wherein:
   the first stage circuit includes a first native threshold voltage (NVT) device and a second NVT device,
   the duty cycle balancer circuit includes a third NVT device,
   the current source stage circuit includes a fourth NVT device, and
   the fourth NVT device of the current source stage circuit is configured to generate a reference current that becomes proportional to a threshold voltage (VTH) of the first NVT device.

5. The amplifier of claim 4, wherein each of the first, second, third, and fourth NVT devices includes a native NMOS transistor.

6. The amplifier of claim 5, wherein the respective VTH of each of the first, second, third, and fourth NVT devices is approximately a zero voltage.

7. The amplifier of claim 6, wherein the first output signal generated from the first stage circuit has a low gain.

8. The amplifier of claim 7, wherein the second output signal generated from the second stage circuit has a high gain.

9. The amplifier of claim 8, wherein the second gain of the second stage circuit is substantially greater than the low gain of the first stage circuit.

10. A method for generating dual voltage TM links, comprising:
   receiving an input signal at a first NVT device of a first stage circuit;
   comparing the input signal with a reference signal at a second NVT device of the first stage circuit, wherein the first and second NVT devices are configured to enable a TM between a first supply voltage and a second supply voltage;
   generating a first output signal in response to the compared input and reference signals;
   receiving the first output signal at a second stage circuit;
   generating a second output signal in response to the first output signal converted through a current folding stage of the second stage circuit;
   generating a duty cycle correction to an output signal generated from a duty cycle balancer circuit, wherein the duty cycle correction is configured based on the second output signal, and wherein the duty cycle balancer circuit includes a third NVT device;
   tracking a transconductance with a current source stage circuit based on the output and input signals, wherein the current source stage circuit includes a fourth NVT device, and
   wherein the fourth NVT device of the current source stage circuit is configured to generate a reference current that becomes proportional to the VTH of the first NVT device.

11. The method of claim 10, wherein the first supply voltage is a 1.8 supply voltage, and wherein the second supply voltage is a 1.2 supply voltage.

12. The method of claim 11, wherein each of the first, second, third, and fourth NVT devices includes a native NMOS transistor, and wherein the VTH of each of the first, second, third, and fourth NVT devices is approximately a zero voltage.

13. The method of claim 10, wherein the first output signal generated from the first stage circuit has a low gain, wherein the second output signal generated from the second stage circuit has a high gain, and wherein the second gain of the second stage circuit is substantially greater than the low gain of the first stage circuit.

14. An amplifier, comprising:
a first stage circuit configured to:
   receive an input signal at a first NVT device;
   compare the input signal with a reference signal at a second NVT device; and
   generate a first output signal based on the compared input and reference signals, wherein the first and second NVT devices are configured to enable a TM between a first supply voltage and a second supply voltage;

a second stage circuit configured to:
   receive the first output signal;
   convert the first output signal with a current folding stage; and
   generate a second output signal in response to the converted first output signal;

a duty cycle balancer circuit configured to provide a duty cycle correction to an output signal generated in response to the second output signal, and wherein the duty cycle balancer circuit includes a third NVT device; and a current source stage circuit configured to track a transconductance based on the output signal and the input signal, wherein the current source stage circuit includes a fourth NVT device, wherein the fourth NVT device of the current source stage circuit is configured to generate a reference current that becomes proportional to the VTH of the first NVT device, and wherein the VTH of each of the first, second, third, and fourth NVT devices is approximately a zero voltage.

* * * * *